(12) United States Patent
Chu et al.

(10) Patent No.: US 8,053,769 B2
(45) Date of Patent: Nov. 8, 2011

(54) ORGANIC TRANSISTOR INVERTER

(75) Inventors: Chih-Wei Chu, Taipei (TW);
Shiau-Shin Cheng, Tungkang (TW)

(73) Assignee: Academia Sinica, Taipei (TW)

( * ) Notice: Subject to any disclaimer, the term of this patent is extended or adjusted under 35 U.S.C. 154(b) by 25 days.

(21) Appl. No.: 12/565,109

(22) Filed: Sep. 23, 2009

(65) Prior Publication Data

US 2010/0073056 A1 Mar. 25, 2010

Related U.S. Application Data

(60) Provisional application No. 61/099,268, filed on Sep. 23, 2008.

(51) Int. Cl.
*H01L 35/24* (2006.01)
*H01L 51/00* (2006.01)
*H01L 29/24* (2006.01)
*H01L 51/30* (2006.01)

(52) U.S. Cl. .................... 257/40; 257/103; 257/E51.049

(58) Field of Classification Search ............... 257/40, 257/10
See application file for complete search history.

(56) References Cited

U.S. PATENT DOCUMENTS

| | | | |
|---|---|---|---|
| 5,563,424 A * | 10/1996 | Yang et al. | 257/40 |
| 6,452,207 B1 * | 9/2002 | Bao | 257/40 |
| 6,946,332 B2 | 9/2005 | Loo et al. | |
| 7,002,176 B2 | 2/2006 | Iechi et al. | |
| 7,276,728 B2 | 10/2007 | Iechi et al. | |
| 7,429,823 B2 * | 9/2008 | Yamamoto et al. | 313/504 |
| 7,692,269 B2 * | 4/2010 | Meng et al. | 257/592 |

OTHER PUBLICATIONS

Chao et al., "Polymer Hot-Carrier Transistor with Low Bandgap Emitter," Applied Physics Letters 92: 093310-1-093310-3 (2008).
Cheng et al., "Influence of Thin Metal Base Thickness on the Performance of CuPc Vertical Organic Triodes," Applied Physics Letters 90:153509-1-153509-3 (2007).
Cheng et al., "Organic Base Triodes and Their Inverters on Flexible Substrates," Adv. Mater. 21:1860-1864 (2009).
Klauk et al., "Low-Voltage Organic Thin-Film Transistors with Large Transconductance," Journal of Applied Physics, 102: 074514 (2007).
Kudo et al., "Device Characteristics of Lateral and Vertical Type Organic Field Effect Transistors," Thin Solid Films, 393:362-367 (2001).
Lee et al., "Low-Voltage-Driven Pentacene Thin-Film Transistor with Organic-Inorganic Nanohybrid Dielectric," Applied Physics Letters 91:123502-1-123502-3 (2007).
Li et al., "Achieveing Ambipolar Vertical Organic Transistors via Nanoscale Interface Modification," Applied Physics Letters 91:083507-1-083507-3 (2007).
Ma Liping, and Yang Yang, "Unique Architecture and Concept for High-Performance Organic Transistors," Applied Physics Letters 85(21): 5084-5086 (2004).
Meruvia et al., "Organic-Metal-Semiconductor Transistor with High Gain," Applied Physics Letters 84(20):3978-3980 (2004).

(Continued)

*Primary Examiner* — Luan C Thai
(74) *Attorney, Agent, or Firm* — Occhiuti Rohlicek & Tsao LLP (57) ABSTRACT

A transistor includes a first semiconductor layer associated with a first electrode; a second semiconductor layer associated with a second electrode; and a discontinuous layer between the first and second semiconductor layer. The discontinuous layer has a plurality of openings being formed on a non-uniform organic surface. Applications of the transistor include an inverter that operates at low supply voltage and high frequency.

17 Claims, 12 Drawing Sheets

OTHER PUBLICATIONS

Nakayama et al., "Charge-Injection-Controlled Organic Transistor," Applied Physics Letters 82(25):4584-4586 (2003).

Nakayama et al., "High-Current and Low-Voltage Operation of Metal-Base Organic Transistors with LiF/Al Emitter," Applied Physics Letters 88: 153512-1-153512-3 (2006).

Nakayama et al., "Improvement in the On/Off Ration of a Vertical-Type Metal-Base Organic Transistor by Heat Treatement in Air," Organic Electronics, 10:543-546 (2009).

Ou et al., "All-Organic Hot-Carrier Triodes with Thin-Film Metal Base," Applied Physics Letters 89: 183508-1-183508-3 (2006).

Yang et al., "Vertical Organic Triodes with a High Current Gain Operated in Saturation Region," Applied Physics Letters 89:183511-1-183511-3 (2006).

Yang, Y., and A.J. Heeger, "A New Architecture for Polymer Transistors," Nature, 372:344-346 (1994).

Yi et al., "High Gain in Hybrid Transistors with Vanadium Oxide/Tris (8-hydoxyquinoline) Aluminum Emitter," Organic Electronics 8:311-316 (2007).

\* cited by examiner

ORGANIC TRANSISTOR INVERTER

CROSS-REFERENCE TO RELATED APPLICATIONS

This application claims priority to U.S. Provisional Application Ser. No. 61/099,268, filed Sep. 23, 2008, and entitled "Organic Transistor Inverter," the contents of which are incorporated herein by reference.

BACKGROUND

This invention relates to organic transistors and inverters.

Organic thin-film transistors (OTFTs) have several advantages over traditional transistors, including, for example, low cost, low processing temperature, mechanical flexibility, and large area coverage. Applications of OTFTs in consumer electronics and optoelectronics include flat-panel display drivers, radio-frequency identification (RFID) tags, smart cards, and sensors.

Conventional OTFTs are designed using the architecture of a typical inorganic metal-oxide-semiconductor field-effect transistor, in which a source terminal and a drain terminal are usually formed on the same plane above or below the transistor's semiconductor layer. The performance of conventional OTFTs is generally influenced by two design parameters: channel length (L) and field-effect mobility ($\mu_{FE}$). One characterization of the performance is the source-drain response time $t_{SD}$, which can be determined by the following equation: $t_{SD} = L^2/(\mu_{FE} \times V_{DD})$, where $V_{DD}$ is the supply voltage.

With conventional OTFTs, it is difficult to reduce this source-drain response time $t_{SD}$ to achieve high operation frequency. One difficulty, for example, is the low field-effect mobility $\mu_{FE}$ of organic semiconductors used in OTFTs. Another difficulty relates to the channel length of the OTFT, which cannot be easily shortened using nano-lithographic techniques. In cases where the channel length of an OTFT can be reduced to the order of sub-micrometers, the contact resistance between its semiconductor layer and electrodes becomes another factor that can affect the performance of this organic device.

SUMMARY

One aspect of the invention relates to a transistor that includes a first semiconductor layer; a second semiconductor layer; and a discontinuous layer between the first and second semiconductor layer. The discontinuous layer has a plurality of openings being formed on a non-uniform organic surface.

Embodiments of this transistor may include one or more of the following features.

The first semiconductor layer represents an emitter layer, the second semiconductor layer represents a collector layer, and the discontinuous layer represents a base layer.

The first semiconductor layer may include a pentacene layer, and may further include an enhancement layer in contact with the pentacene layer. The enhancement layer may include a LiF layer and a NPB layer. The enhancement layer includes at least one of tungsten oxide ($WO_3$), vanadium oxide ($V_2O_5$), molybdenum oxide ($MoO_3$), and cesium carbonate ($Cs_2CO_3$). The second semiconductor layer may include a pentacene layer. The discontinuous layer may be made of Al and may have an average thickness of less than 10 nm.

The transistor may further include first and second electrodes electrically connected to the first and second semiconductor layers, respectively. Each of the first and the second electrodes can be made of various materials, including metals such as gold (Au), titanium (Ti), copper (Cu), silver (Ag), and aluminum (Al). The transistor may also include a third electrode electrically connected to the discontinuous layer. The third electrode may be made of various materials that have relatively low work functions, including metals such as aluminum (Al), silver (Ag), and magnesium (Mg).

Another aspect of the invention relates to an inverter that includes a transistor for receiving an input signal and for generating an output signal, and a resistor coupled in series with the transistor. The transistor includes a first semiconductor layer associated with a first electrode; a second semiconductor layer associated with a second electrode; and a discontinuous layer between the first and second semiconductor layer. The output signal satisfies a predetermined criterion in relation to the input signal.

Embodiments of this inventor may include one or more of the following features.

The input signal includes an input voltage signal, and the output signal includes an output voltage signal. The predetermine criterion includes, when a magnitude of the input voltage signal is within a predetermined range, the output voltage signal is in reverse polarity with the input voltage signal.

The discontinuous layer is associated with a third electrode. The input signal is received at the third electrode and the output signal is generated at the second electrode.

The inverter may be further configured to be able to operate at a frequency of at least 2000 Hz.

The first semiconductor layer may include a pentacene layer or a PTCDI layer. The second semiconductor layer may include a pentacene layer or a $C_{60}$ layer. The discontinuous layer may be made of Al. The plurality of openings are formed on a non-uniform organic surface.

Another aspect of the invention relates to an inverter that includes a first transistor having a first base electrode for receiving an input signal and a first collector electrode for providing an output signal that satisfies a predetermined criterion in relation to the input signal; and a second transistor having a second base electrode and emitter electrode each connected to the first collector electrode of the first transistor. At least one of the first and second transistors has a first and a second semiconductor layer and a discontinuous layer between the first and second semiconductor layer. Each of the first and second transistors may be a p-type transistor, or alternatively, an n-type transistor.

Another aspect of the invention relates to an inverter that has a first transistor having a first base electrode for receiving an input signal and a first collector electrode for providing an output signal that satisfies a predetermined criterion in relation to the input signal; and a second transistor having a second base electrode connected to the first base electrode and a second collector electrode connected to the first collector electrode. At least one of the first and second transistors has a first and a second semiconductor layer and a discontinuous layer between the first and second semiconductor layer. The first and second transistors may be respectively a p-type and n-type transistor, or alternatively, an n-type and p-type transistor, or both be ambipolar transistors.

Among many advantages and features, an organic transistor has a vertical layout in which the conductive channel is perpendicular to the substrate. With this arrangement, the channel length L can be directly controlled by the combined thickness of the transistor's organic films, which can be reduced, for example, to sub-micrometers. As a result, higher operating frequency and lower operating voltage can be achieved.

One embodiment of the organic transistor is in the form of an organic-based modulation triode (OBMT), which can be fabricated by employing two back-to-back diodes on a flexible substrate. When various supply voltages are applied to the base electrode, the OBMT exhibits current modulations with apparent saturation. By integrating an OBMT with a suitable load resistor or with another OBMT of similar configuration, an organic inverter that operates at low supply voltage and high frequency can be achieved.

Other features and advantages of the invention are apparent from the following description, and from the claims.

DETAILED DESCRIPTION

1 Organic Transistor

Figure 1A:
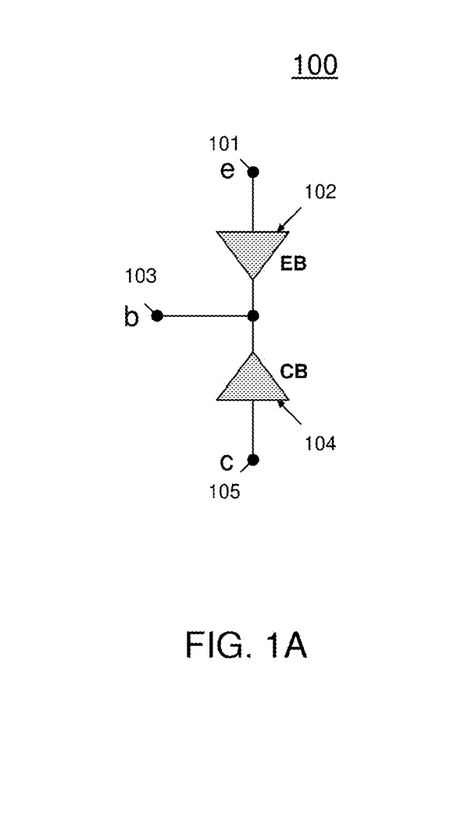
FIG. 1A is a schematic diagram of an exemplary OBMT.

Referring to FIG. 1A, an organic-based modulation triode (OBMT) 100 includes two diodes 102 and 104 in a back-to-back configuration. Here, diode 102 is referred to as an emitter-base (EB) diode and diode 104 is referred to as a collector-base (CB) diode. OBMT 100 also includes three terminals (electrodes), including emitter 101, base 103, and collector 105. These three terminals provide OBMT 100 with electrical connection to external devices and/or circuits. By controlling an input voltage at base 103, current flowing from emitter 101 to collector 105 can be modulated.

Figure 1B:
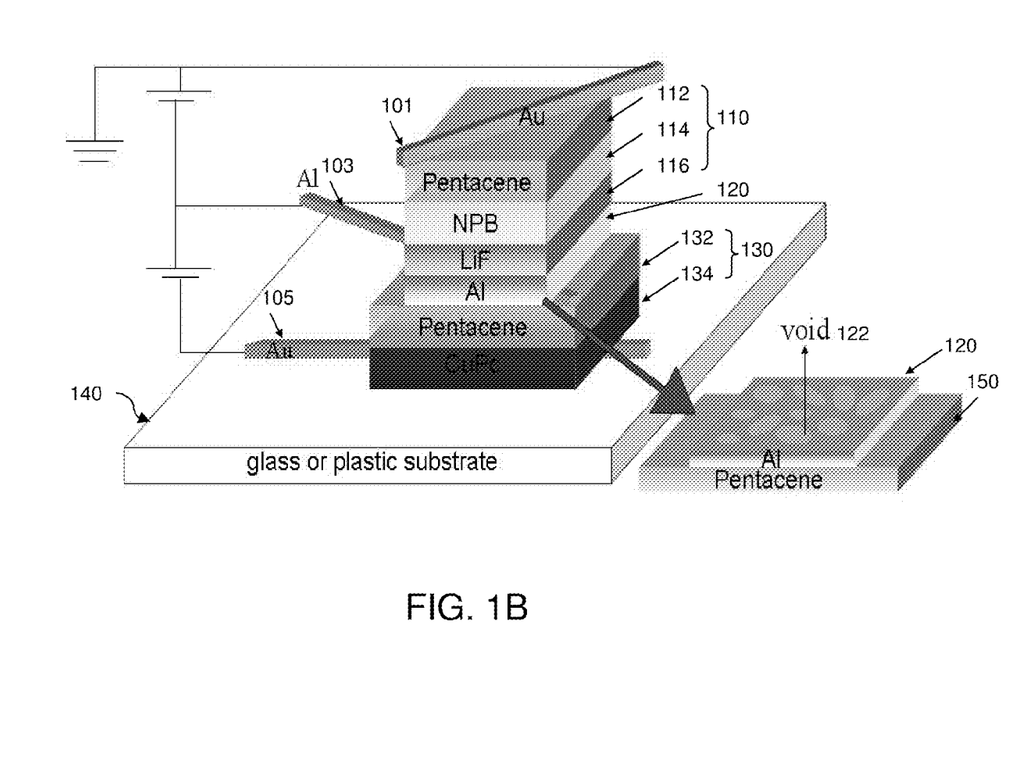
FIG. 1B is a diagrammatic view of the OBMT of FIG. 1A.

Referring to FIG. 1B, one example of OBMT 100 is formed over a glass or plastic substrate 140. In this example, CB diode 104 includes a collector layer 130 and a base layer 120. EB diode 102 includes base layer 120 and an emitter layer 110.

Collector layer 130 is made of semiconductor materials, including for example, a phthalocyanine (CuPc) layer 134 and a pentacene layer 132.

Base layer 120 is formed over collector layer 130 using a thin aluminum (Al) layer that has multiple voids 122. Voids 122 are formed, for example, by thermally evaporating a thin Al layer on a non-uniform organic surface 150 (for example, a non-uniform pentacene surface). Base layer 120 provides a path for current to flow from emitter layer 110 to collector layer 130 through voids 122.

Figure 10:
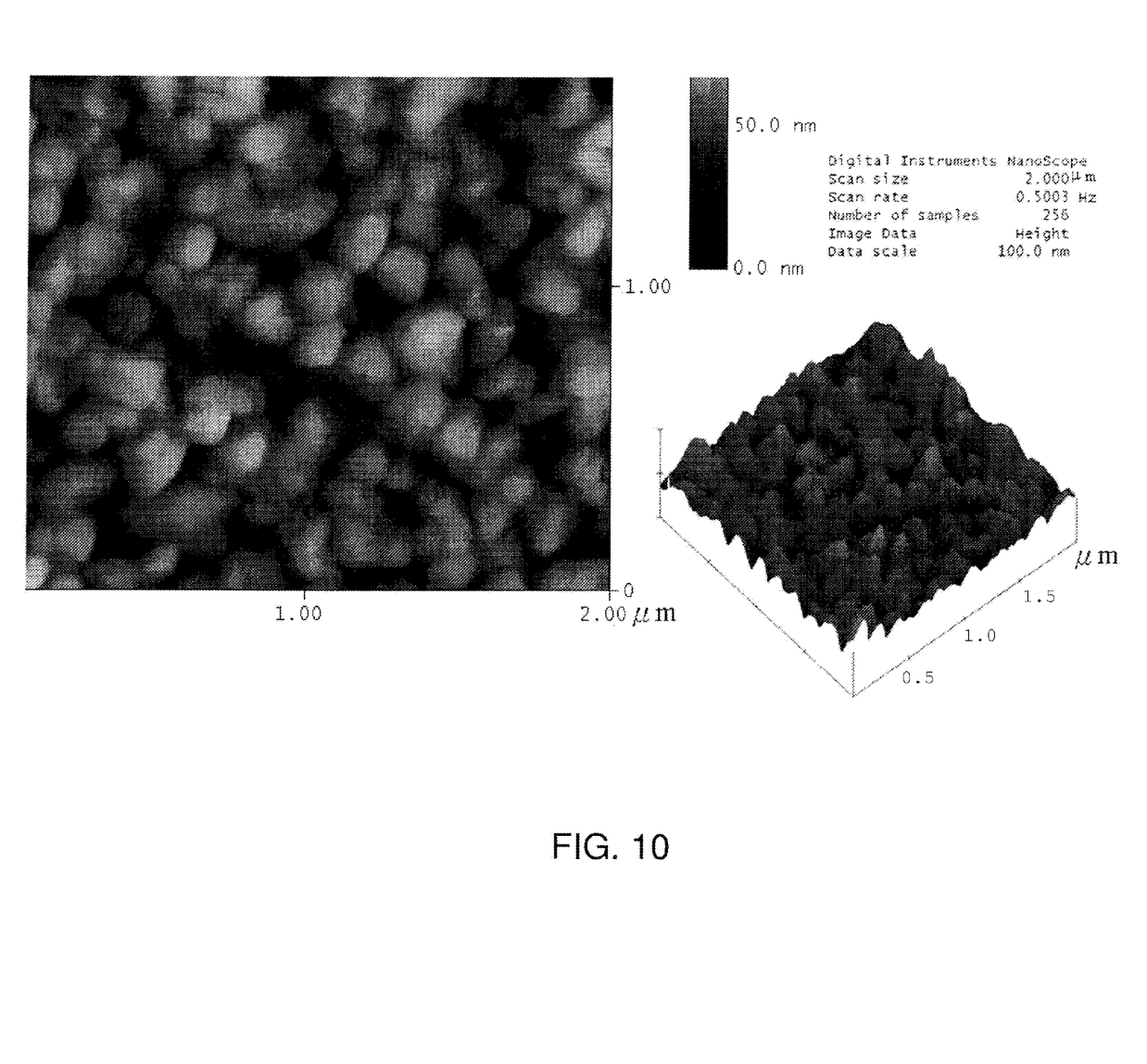
FIG. 10 is an atomic force microscopy (AFM) image of the surface morphology of an exemplary non-uniform organic surface over which the base layer of FIG. 1B can be formed.

FIG. 10 illustrates an exemplary non-uniform surface upon which the Al layer 120 can be formed. The surface roughness is measured using an atomic force microscopy (AFM) technique. In this example, the root-mean-square (RMS) of the surface morphology is 13.3 nm. In general, the RMS roughness is greater than about 10 nm.

Emitter layer 110 is made of semiconductor materials, including for example, a pentacene layer 112, a N,N'-bis(naphthalen-1-yl)-N,N'-bis(phenyl)-benzidine (NPB) layer 114, and a LiF layer 116. Generally, LiF layer 116 serves as a carrier enhancement layer, and NPB layer 114 serves as a carrier energy enhancement layer (also referred to herein as an "energizer"), as described below. In other embodiments, layer 116 is formed of a transition metal oxide such as tungsten oxide ($WO_3$), vanadium oxide ($V_2O_5$), molybdenum oxide ($MoO_3$), cesium carbonate ($Cs_2CO_3$), or another material capable of enhancing the performance of OBMT 100.

Figure 11:
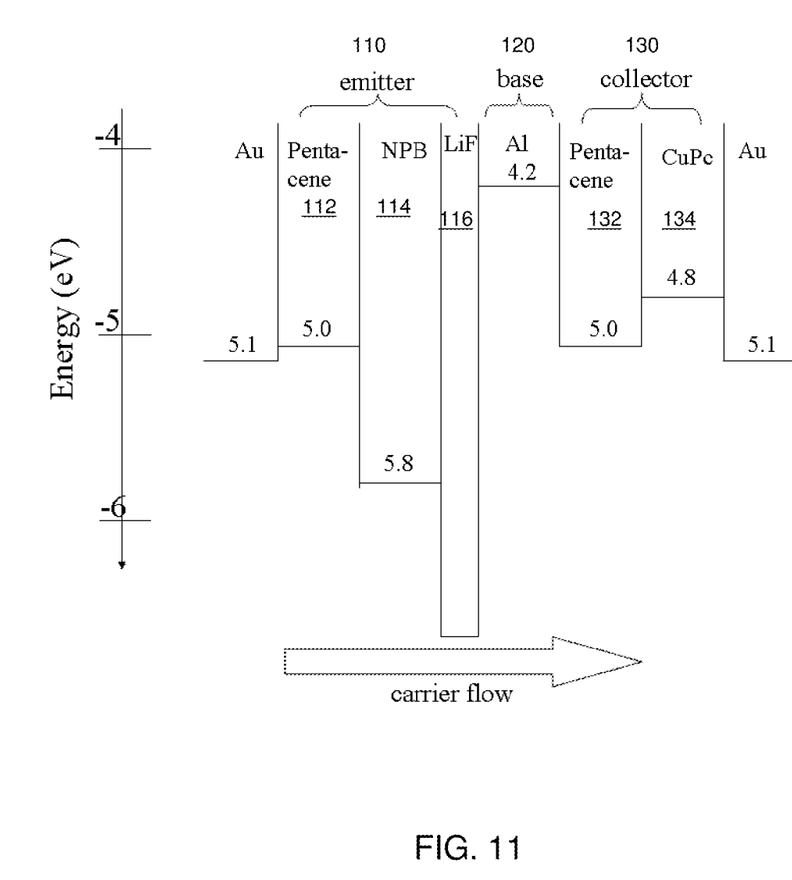
FIG. 11 is a graph of the various energy levels of the metal and semiconductor layers of the OBMT of FIG. 1B.

FIG. 11 shows an example of the work functions of different metals and the highest occupied molecular orbital (HOMO) below vacuum levels of the different organic materials in OBMT 100. Because the HOMO energy of NPB layer 114 is greater than pentacene layer 112, an energy gap exists between NPB layer 114 and pentacene layer 112. This energy gap can enhance carrier energy when carriers travel from pentacene layer 112 into NPB layer 114. LiF layer 116 can be considered as an insulator, serving as a barrier between NPB layer 114 and base layer 120. As the carriers tunnel through the barrier into collector layer 130, a tunnel current is formed. The tunnel current can be raised exponentially and the LiF layer 116 serves as a carrier enhancement layer.

The three electrodes of OBMT 100, which are collector 105, base 103, and emitter 101, are made of thin strips of gold (Au), aluminum (Al), and gold, respectively. Generally, in a p-type configuration, collector 105 and emitter 101 can be made of various materials that have relatively high work functions, such as gold (Au), titanium (Ti) and copper (Cu). Base 103 can be made of various materials that have relatively low work functions, such as aluminum (Al), silver (Ag), and magnesium (Mg).

In this example, OBMT 100 is essentially a p-type transistor because of the nature of the selected semiconductor materials. However, in other examples, n-type OBMTs can be conveniently configured using alternative semiconductor materials. Accordingly, the emitter and collector electrodes of an n-type OBMT can be made of low-work-function materials, while the base electrode can be made of high-work-function materials.

Figure 2:
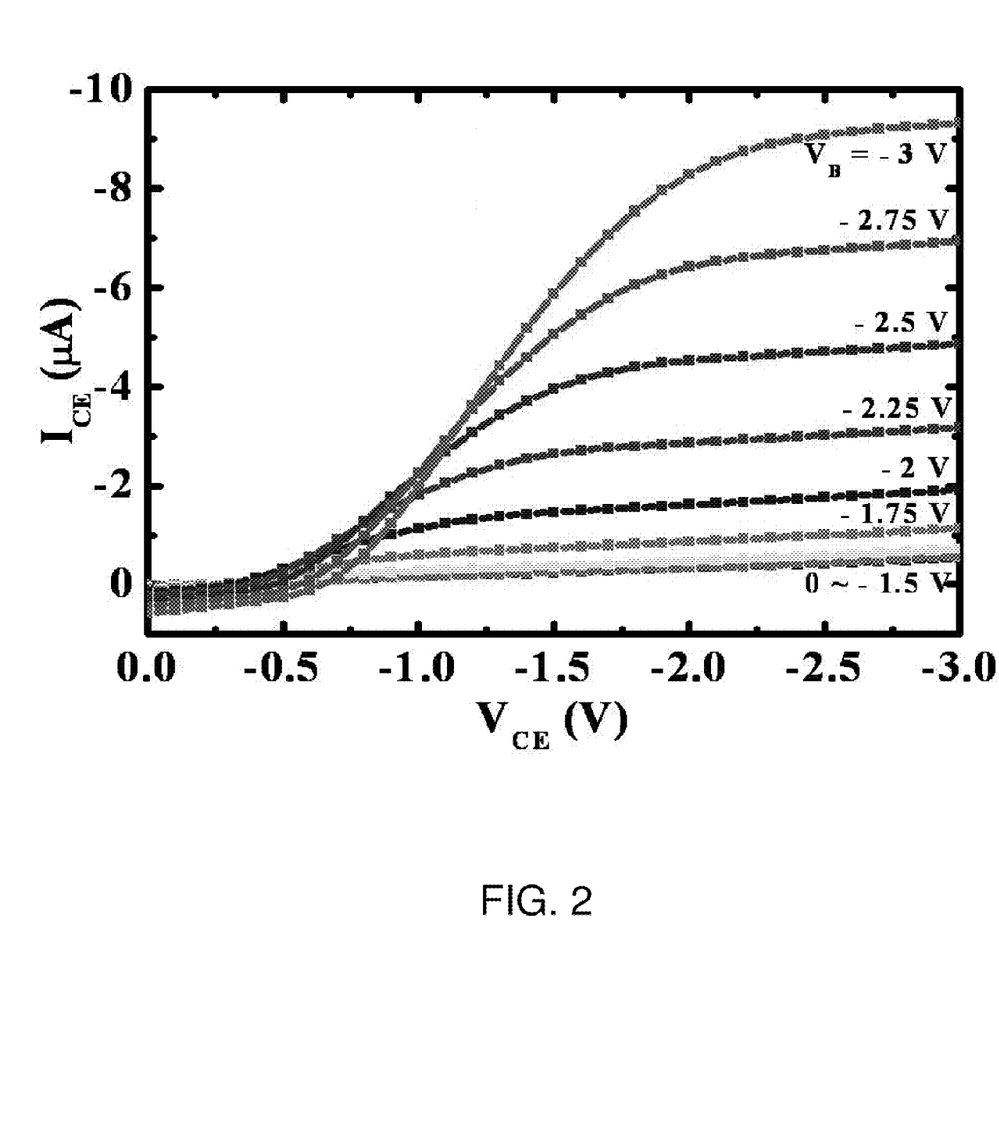
FIG. 2 is a graph showing current-voltage characteristics for the OBMT of FIG. 1A.

Referring to FIG. 2, the collector-to-emitter current ($I_{CE}$) of OBMT 100 is shown as a function of collector-to-emitter voltage ($V_{CE}$). When supplied with a low base voltage $V_B$, OBMT 100 is able to provide a relatively large output current $I_{CE}$ with an apparent saturation region. For example, with $V_B$ applied at −3 V, $I_{CE}$ can reach up to −9.33 μA and saturate near $V_{CE}$ of −3 V. The on/off current ratio, defined as $J_{CE}$ ($V_B$=−3 V)/$J_{CE}$ ($V_B$=0 V) at $V_{CE}$=−3 V, is about 18 in this example. As a characteristic of the switching performance of OBMT 100, this on/off ratio can be further increased by 1) reducing the off-current $J_{CE}$ ($V_B$=0 V), for example, by increasing the thickness of the CB diode 104, or 2) enhancing the on-current $J_{CE}$ ($V_B$=−3 V), for example, by selecting electrodes with suitable work-functions as well as by reducing the thickness of EB diode 102.

Although OBMT 100 exhibits typical p-channel characteristics similar to conventional OTFTs, it works under different scenarios. As shown in FIG. 2, when CB diode 104 is under reverse bias (e.g., $V_B$=−2.5 V), increasing the magnitude of $V_{CE}$ can cause the diode to saturate. When saturation occurs, $I_{CE}$ is dominated by the emitter-to-base current $I_{EB}$. As the magnitude of bias $V_B$ increases, the positive current flow (i.e., the emitter-to-collector current $I_{EC}$) also increases. Because base layer 120 is a thin Al layer with multiple voids, the base recombination current can be effectively reduced, and part of the emitter current can flow through base 103 to form a collector current. Consequently, $I_{CE}$ can be modulated with apparent saturation by varying base voltage $V_B$. This process requires that the thickness of base layer 120 be less than the mean free path of the carriers. When base layer 120 is made of a thick Al film that has few or no voids, OBMT 100 shows either lower current modulation without an apparent saturation region, or no current modulation. The surface morphology (e.g., roughness and non-uniformity) of organic surface 150 on which thin Al layer 120 is formed and the thickness of the base electrode 103 can also affect the current modulation of OBMT 100.

The field-effect mobility of OBMT 100 can be determined as follows. Since OBMT 100 can be viewed as essentially being composed of two diodes 102 and 104, the effective field-effect mobility (μ*) is given by:

$$\frac{1}{\mu^*} = \frac{1}{\mu_{EB}} + \frac{1}{\mu_{CB}} \quad (1)$$

where $\mu_{EB}$ is the field-effect mobility of EB diode 102, and $\mu_{CB}$ is the field-effect mobility of CB diode 104. To calculate μ*, $\mu_{EB}$ and $\mu_{CB}$ can be obtained as discussed below.

Figure 3:
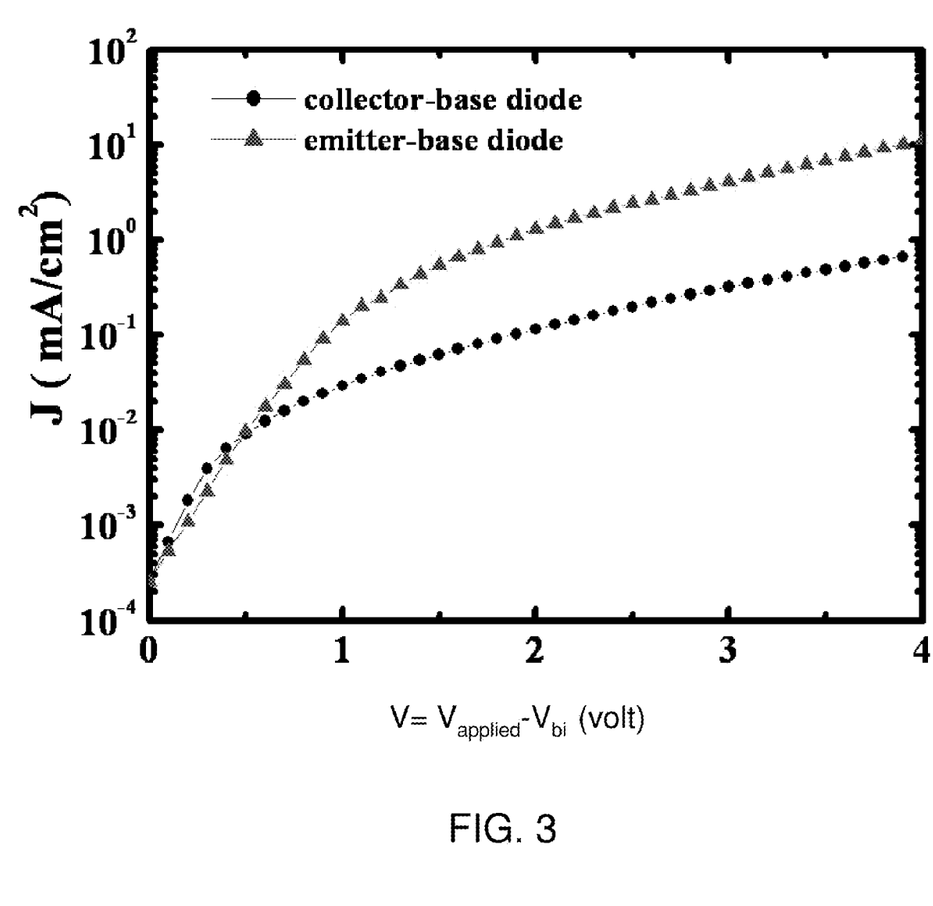
FIG. 3 is a graph showing current density as a function of voltage for the collector-base diode and emitter-base diode in the OBMT of FIG. 1A.

Referring to FIG. 3, the current density (J) versus voltage (V) characteristics of EB diode 102 and CB diode 104 are used for estimating values for $\mu_{EB}$ and $\mu_{CB}$. The x-axis in FIG. 3 refers to a corrected voltage V, obtained by subtracting a built-in potential $V_{bi}$ from an actual input voltage $V_{applied}$ across a diode. Here, the built-in potential $V_{bi}$ corresponds to the work function differential between EB and CB diode 102 and 104. When $V_{applied}$ overcomes $V_{bi}$, indicating that a flat band condition is reached, the current density J increases quadratically with corrected voltage V, which is common for low-mobility and disordered semiconductors. Using a space charge limited conduction (SCLC) model, the field-effect mobility of each of the EB and CB diode 102 and 104 can be determined by:

$$J = \frac{8}{9} \varepsilon_0 \varepsilon_r \mu \frac{V^2}{L^3} \quad (2)$$

where J is the current density, $\varepsilon_0$ is the vacuum permittivity, $\varepsilon_r$ is the dielectric constant, V is the corrected voltage drop across each diode, and L is the combined thickness of all of the semiconductor layers in each diode. From equation (2), the field-effect mobility of EB diode 102 and CB diode 104 are $9.75 \times 10^{-5}$ and $1.05 \times 10^{-5}$ cm$^2$/V-s, respectively. Therefore, the effective field-effect mobility μ* of OBMT 100 is $9.48 \times 10^{-6}$ cm$^2$/V-s, using equation (1) above. Although μ* of OBMT 100 is much smaller than that of conventional OTFTs, which typically is about $5.5 \times 10^{-2}$ cm$^2$/V-s, the short channel length of OBMT 100 (i.e., between 400–500 nm in this example) still allows it to be operated at relatively low voltages with a high output current.

Figure 4:
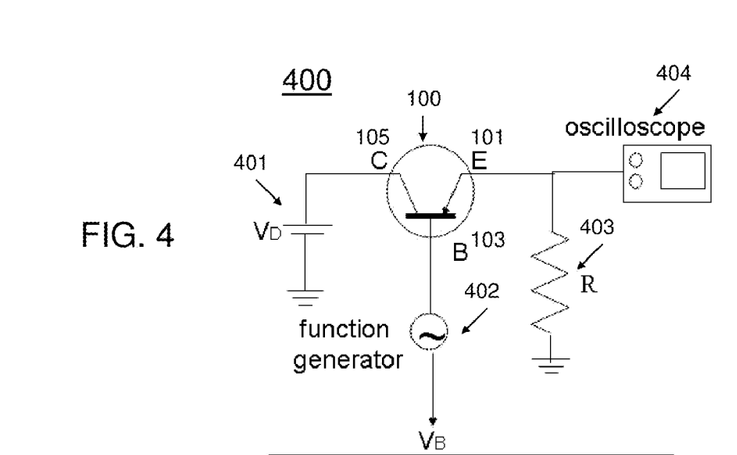
FIG. 4 is a schematic diagram of a test circuit for measuring the current dynamics of the OBMT of FIG. 1A FIGS. 5A-5C are graphs showing the current density dynamics of the OBMT under input voltage of varying frequencies.

Referring to FIG. 4, the dynamic characteristics of OBMT 100 can be further analyzed in a test circuit 400. Here, collector 105, base 103, and emitter 101 (also shown as C, B, and E) are respectively connected to a DC source 401, a function generator 402, and a resistor 403 of 300 kΩ. Function generator 402 provides an input voltage $V_B$ at base 103 in an alternating rectangular waveform. An oscilloscope 404 measures the density $J_{BE}$ of emitter current that flows through resistor 403.

Figure 5A:
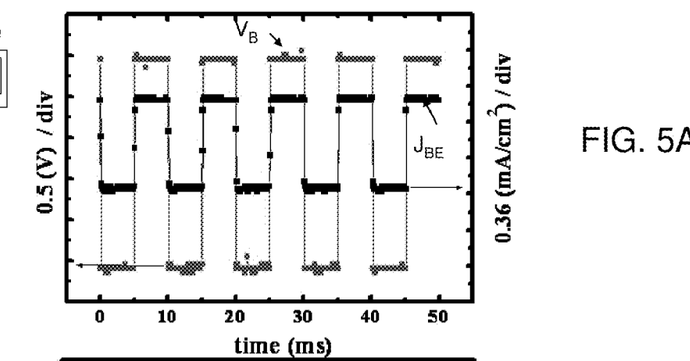
Figure 5B:
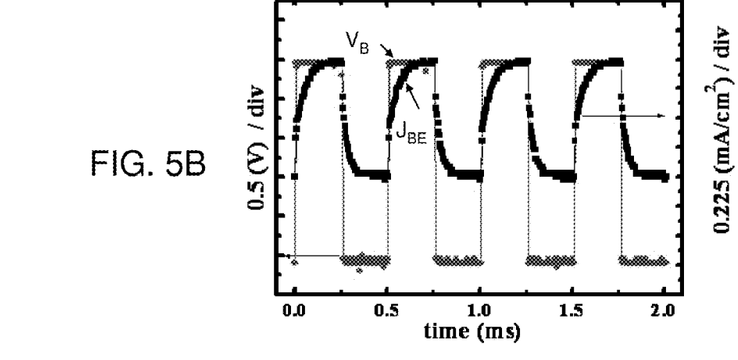
Figure 5C:
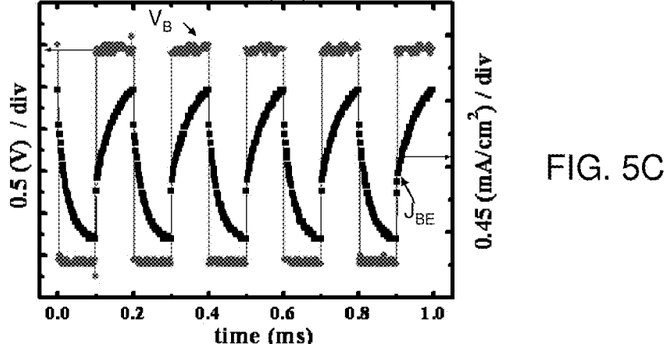

Referring to FIGS. 5A-5C, the emitter current density $J_{BE}$ is shown as a function of input voltage $V_B$ at varying frequencies of 100 Hz, 2 kHz, and 5 kHz, respectively. In FIG. 5A, the waveform of $J_{BE}$ follows the alternating square waveform of input $V_B$ at 100 Hz. As the input frequency increases from 100 Hz to 2 kHz and further to 5 kHz, partial and full distortions in output waveforms are observed (in FIGS. 5B and 5C). Here, the maximum operating frequency of OBMT 100 is 5 kHz. In comparison, the operating frequency of some conventional pentacene-based OTFTs' is less than 100 Hz. With a shorter channel length, OBMT 100 exhibits not only lower power consumption, but also a higher operating frequency than some conventional OTFTs. The comparison of the performance of these two types of transistors is further shown in Table 1.

TABLE 1

Electrical properties of OBMTs and conventional pentacene-based OTFTs.

| | OBMT | Planar-type OTFT |
|---|---|---|
| Field-effect mobility (cm 2/Vs) | $9.48 \times 10^{-6}$ | $5.5 \times 10^{-2}$ |
| Output current (μA) | 9.33 ($V_B$ = −3, $V_{CE}$ = −3) | 1.67 ($V_G$ = −40, $V_{SD}$ = −40) |
| Current on/off ratio | 18 | $4 \times 10^4$ |
| Operating frequency (Hz) | 2000 | 70 |

2 Organic Inverters

OBMTs are useful in many applications. One application, for example, is an organic inverter made by an OBMT coupled in series with a resistor.

Figure 6:
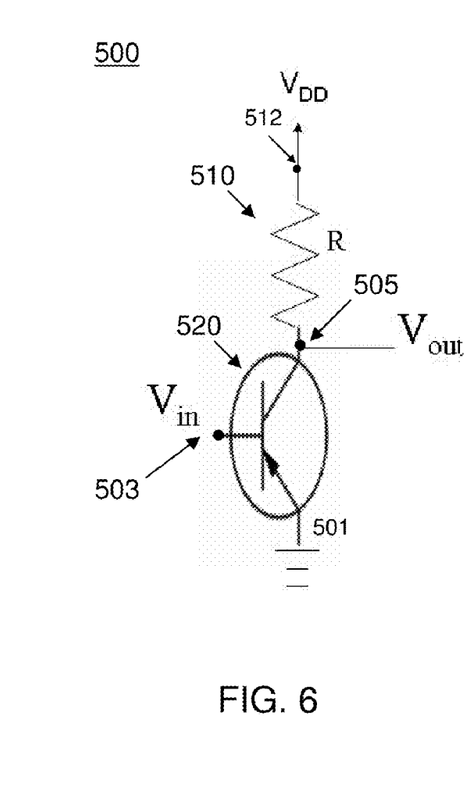
FIG. 6 is a schematic diagram of one embodiment of an organic inverter that includes the OBMT of FIG. 1A.

Referring to FIG. 6, one embodiment of a load-resistance inverter 500 includes a variable resistor 510 connected to collector 505 of an OBMT 520. Variable resistor 510 is controlled to provide varying resistances ranging from 100 to 500 kΩ at steps of 100 kΩ. A supply DC voltage $V_{DD}$ of −5 V is provided at terminal 512. An input voltage $V_{in}$ is provided at base 503, for example, by a function generator (not shown). Output voltage $V_{out}$ is measured at collector 505.

Figure 7A:
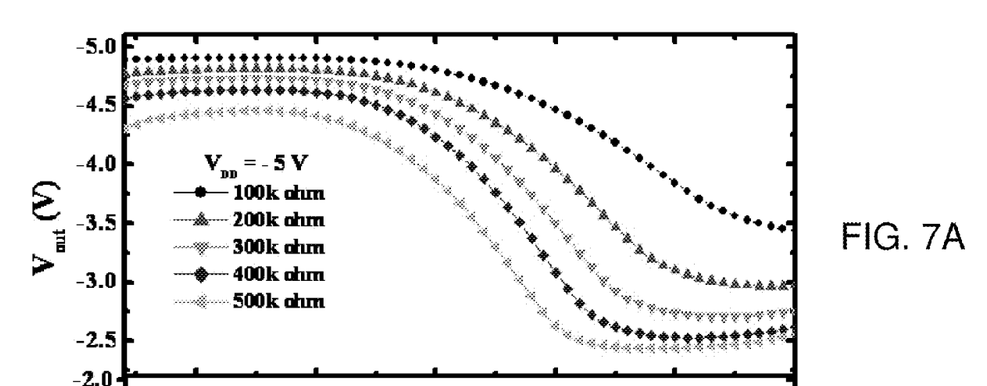
FIGS. 7A and 7B are graphs showing the output voltage and gain, respectively, of the organic inverter as a function of input voltage.
Figure 7B:
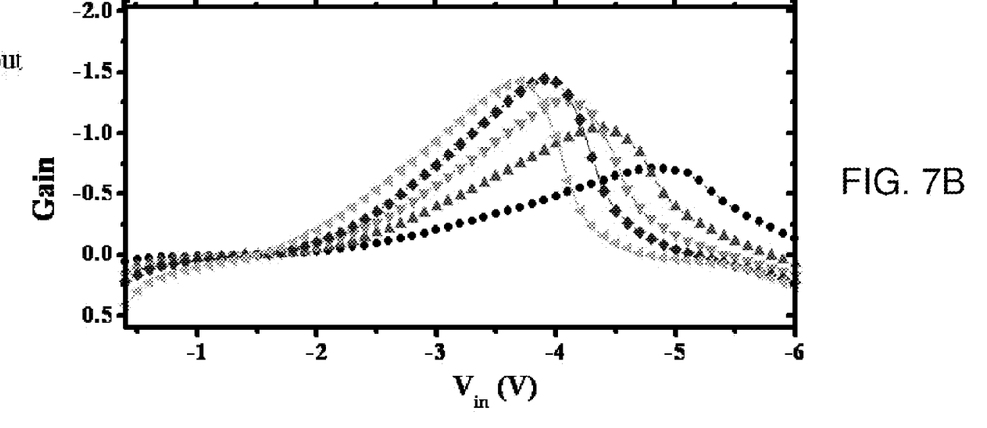

Referring to FIGS. 7A and 7B, the voltage transfer characteristics and corresponding gain (defined as −d$V_{out}$/d$V_{in}$) of inverter 500 are shown as a function of input voltage $V_{in}$. When the input voltage $V_{in}$ is "low" (e.g., at −1 V), OBMT 520 is turned off, and the output voltage $V_{out}$ corresponds to "high" voltage (e.g., near −5.0 V). When the input voltage is "high" (e.g., at −5 V), OBMT 520 is turned on, and the output voltage becomes relatively "low" (e.g., near −2.5 V). Ideally, when OBMT 520 is off at "low" input voltages, no current passes through resistor 510 and $V_{out}$ should be equal to $V_{DD}$. In practice, however, the magnitude of $V_{out}$ is slightly lower than the magnitude of $V_{DD}$ due to the presence of a leakage current through OBMT 520. In this example, the highest voltage gain (about 1.5) occurs when OBMT 520 is connected to a resistor of 400 kΩ and the input voltage $V_{in}$ is near −4 V. The voltage gain of inverter 500 can be further improved, for example, by lowering the off-current of OBMT 520.

Figure 8:
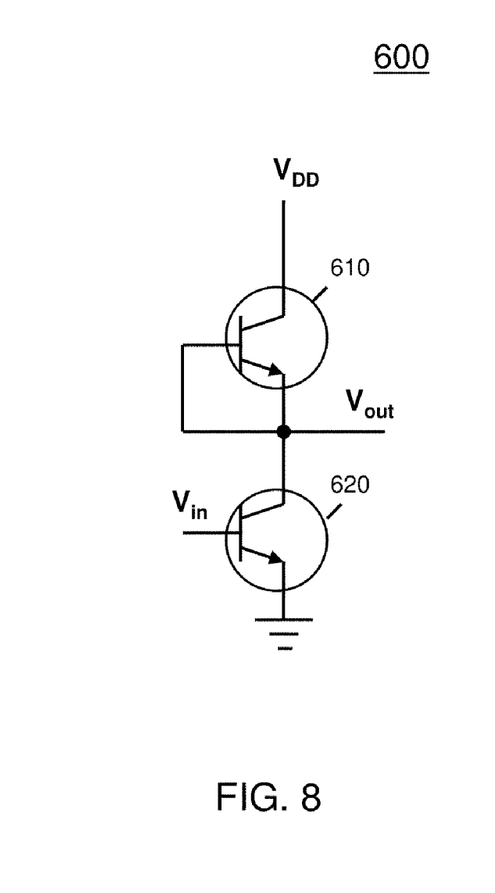
FIG. 8 is a schematic diagram of a second embodiment of an organic inverter that includes two n-type OBMTs.

Referring to FIG. 8, a second application of OBMTs is an organic inverter 600 that includes two n-type (or alternatively, p-type) OBMTs 610 and 620 connected in series. Both of the base and emitter of OBMT 610 are connected to the collector of OBMT 620. A supply voltage $V_{DD}$ is provided at the collector of OBMT 610. The base of OBMT 620 serves as an input terminal for receiving input voltage $V_{in}$, whereas the collector of OBMT 620 serves as an output terminal for providing output voltage $V_{out}$.

Figure 9:
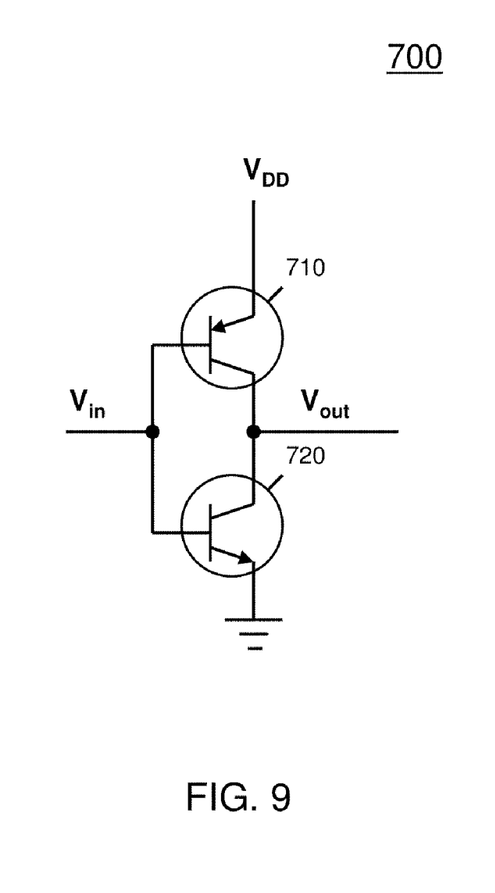
FIG. 9 is a schematic diagram of a third embodiment of an organic inverter that includes a pair of n-type and p-type OBMTs.

Referring to FIG. 9, a third application of OBMTs is an organic inverter 700 that includes a pair of p-type OBMT 710 and n-type OBMT 720. A supply voltage $V_{DD}$ is provided at the emitter of OBMT 710. The bases of OBMTs 710 and 720 are connected and together serve as an input terminal for receiving input voltage $V_{in}$. The collectors of OBMTs 710 and 720 are connected and together serve as an output terminal for providing output voltage $V_{out}$.

Figure 12:
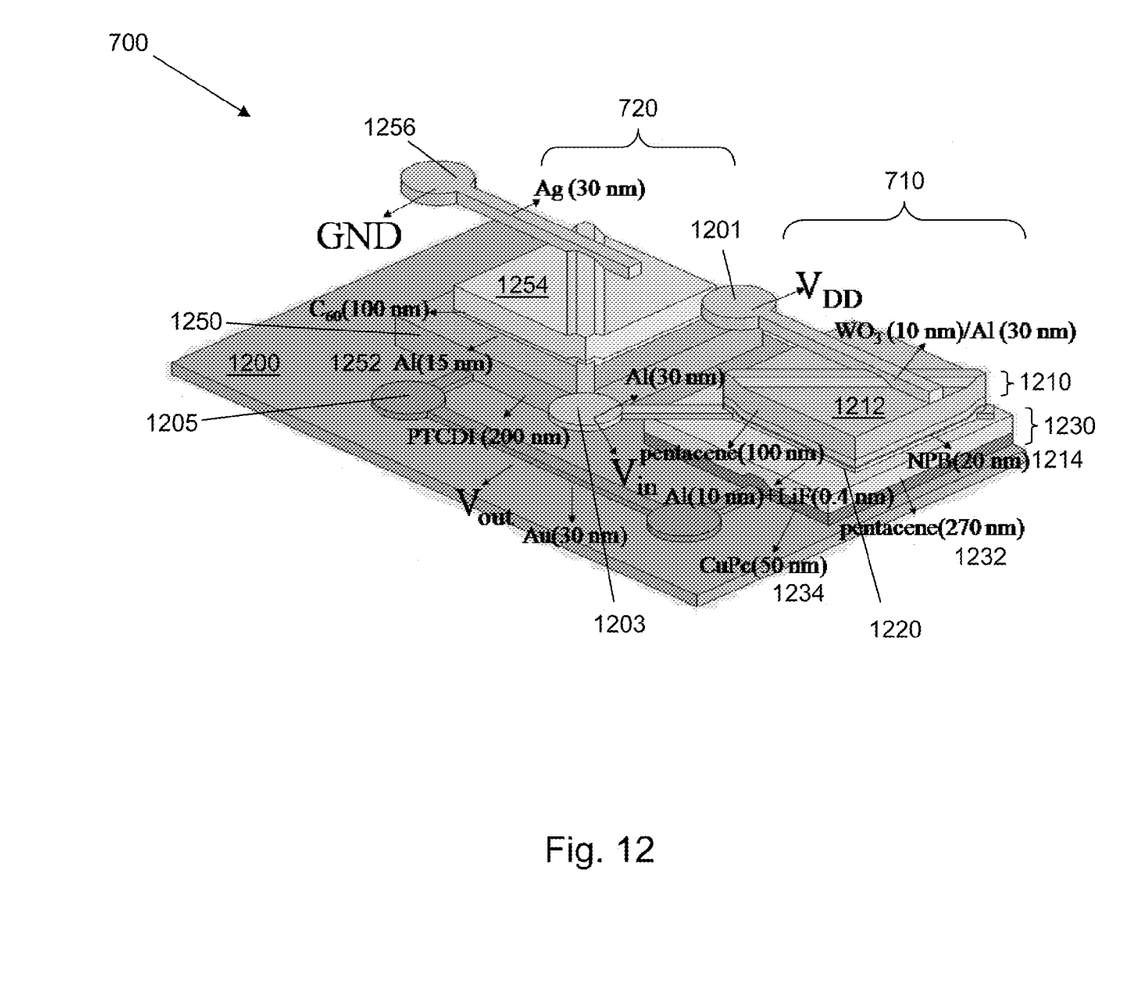
FIG. 12 is a diagrammatic view of an organic complementary inverter.

Referring to FIG. 12A, complementary organic inverter 700 includes p-type OBMT 710 and n-type OBMT 720 formed on a glass or plastic substrate 1200. P-type OBMT 710 includes a collector layer 1230, an Al base layer 1220, and an emitter layer 1210. Collector layer 1230 and emitter layer 1210 are formed of layers of organic semiconductors. Collector layer 1230 includes a phthalocyanine (CuPC) layer 1234 and a pentacene layer 1232 and is formed in contact with a collector electrode 1205. Above collector layer 1230, Al base layer 1220 connects to an Al base electrode 1203. In some embodiments, base layer 1220 contains voids (not shown) that provide a path for current to flow from emitter layer 1210 to collector layer 1230. Emitter layer 1210 includes a thin LiF layer, which functions as a hole injection enhancement layer; an NPB layer 1214, and a pentacene layer 1212. In some embodiments, the hole injection enhancement layer is formed of a transition metal oxide such as tungsten oxide ($WO_3$), vanadium oxide ($V_2O_5$), molybdenum oxide ($MoO_3$), cesium carbonate ($Cs_2CO_3$), or another material capable of enhancing the performance of OBMT 710. Above emitter layer 1210, an emitter electrode 1201 is formed of a layer of tungsten (VI) oxide ($WO_3$) and a layer of Al. P-type OBMT 710 is similar to the p-type OBMT 100 shown in FIG. 1B, with the exception that emitter electrode 1201 of OBMT 710 is formed of $WO_3$ and Al, while emitter electrode 101 of OBMT 100 is formed of Au.

N-type OBMT 720 is also formed of a collector layer 1250, a base layer 1252, and an emitter layer 1254 deposited over collector electrode 1205. Collector layer 1250 is formed of N,N'-dioctyl-3,4,9,10-perylenedicarboximide (PTCDI). Al base layer 1252 connects to base electrode 1203. In some embodiments, base layer 1252 contains voids that provide a path for current to flow from emitter layer 1254 to collector layer 1250. Emitter layer 1254 is formed of $C_{60}$. In contact with emitter layer 1254, an emitter electrode 1256 is formed of silver (Ag).

Figure 13A:
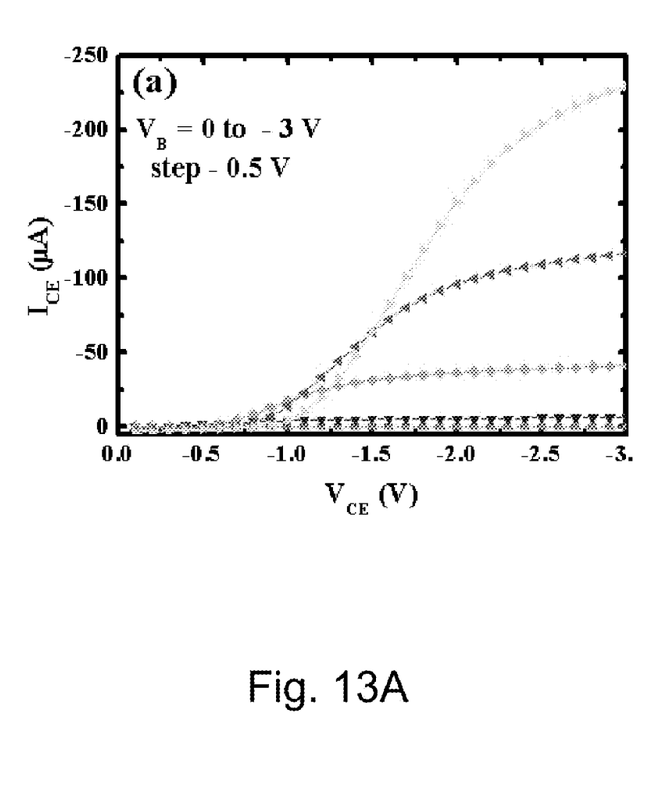
FIGS. 13A and 13B are graphs showing the current-voltage characteristic for a p-type OBMT and an n-type OBMT, respectively.
Figure 13B:
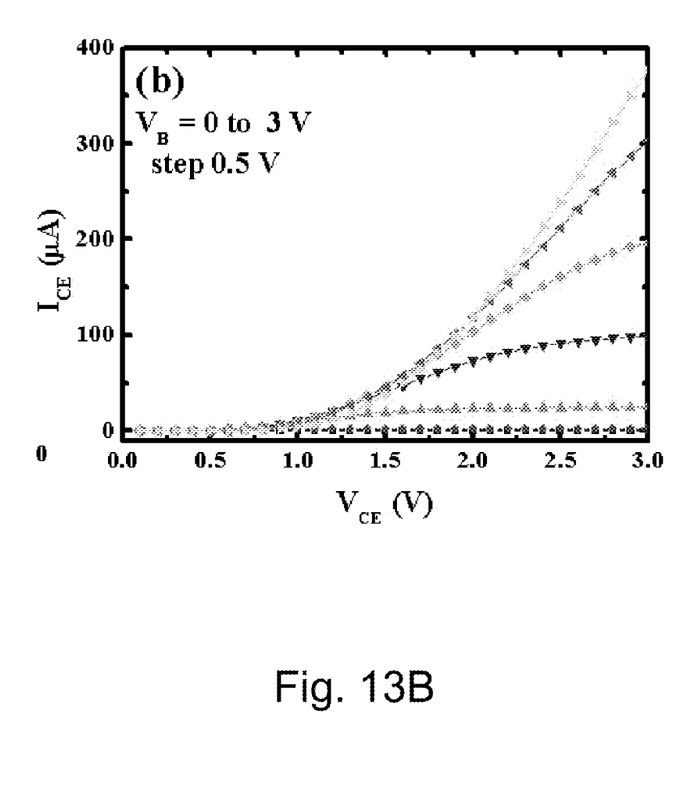

Referring to FIGS. 13A and 13B, the collector-to-emitter current ($I_{CE}$) is shown as a function of the collector-to-emitter voltage ($V_{CE}$) for p-type OBMT 710 and n-type OBMT 720, respectively. Each curve corresponds to a different base voltage Base voltages ranging from 0 V to −3 V, with a step size of 0.5 V, were used for measurements on p-type OBMT 710; base voltages ranging from 0 V to 3 V, with a step size of 0.5 V, were used for measurements on n-type OBMT 720. The ON current, OFF current, and turn-on voltage (i.e., the voltage when $I_{CE}=0$) are shown for p-type OBMT 710 and n-type OBMT 720 are given in Table 2.

TABLE 2

Performance of p-type and n-type OBMTs

|  | ON current | OFF current | Turn-on voltage |
|---|---|---|---|
| p-type OBMT | −229 mA ($V_B = -3$ V) | −67.6 nA ($V_B = 0$ V) | −0.8 V |
| n-type OBMT | 377 µA ($V_B = 3$ V) | 86.9 nA ($V_B = 0$ V) | 0.4 V |

For comparison, the ON current for the p-type OBMT 100 shown in FIGS. 1B and 2 is −9.33 µA at $V_B=-5$ V, which is about an order of magnitude less than the ON current of OBMT 710. The ON current of OBMT 100 is also significantly less than the ON current of a comparable n-type OBMT due to the fact that electrons have a longer mean free path in metal films than do holes. As a result, electrons have a lower probability of recombining at the base layer of an n-type OBMT than do holes at the base layer of a p-type OBMT. Thus, a greater number of electrons than holes diffuse through the base layer and into the collector layer of their respective OBMT.

For efficient operation of a complementary organic inverter (e.g., inverter 700), current matching between the p-type OBMT and the n-type OBMT is important. Increasing the ON current of the p-type OBMT to approach the level of the ON current of the n-type OBMT will contribute to improved performance of the inverter. In inverter 700, the emitter electrode 1201 of p-type OBMT 710 is formed of $WO_3$ and Al instead of Au, as it is in OBMT 100. The $WO_3$ lowers the barrier between the Al layer of emitter electrode 1201 and pentacene layer 1212, thus preventing the reaction and/or diffusion of the Al into the active emitter layer 1210. The use of $WO_3$ and Al rather than Au in the emitter electrode increases the ON current of the OBMT by about an order of magnitude. However, the ON current of p-type OBMT 710 remains slightly less than the ON current of n-type OBMT 720. To further improve the performance of OBMT 710, a material having a higher energy level may be inserted between NPB layer 1214 and the thin Al layer 1220 in order to raise the energy of the carriers in the device.

Figure 14A:
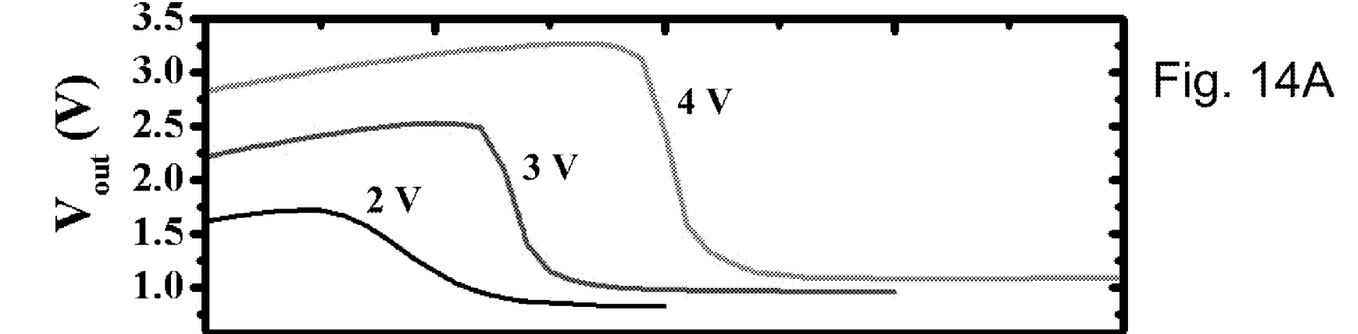
FIGS. 14A and 14B are graphs showing the output voltage and gain, respectively, as a function of input voltage for the organic complementary inverter of FIG. 12A.
Figure 14B:
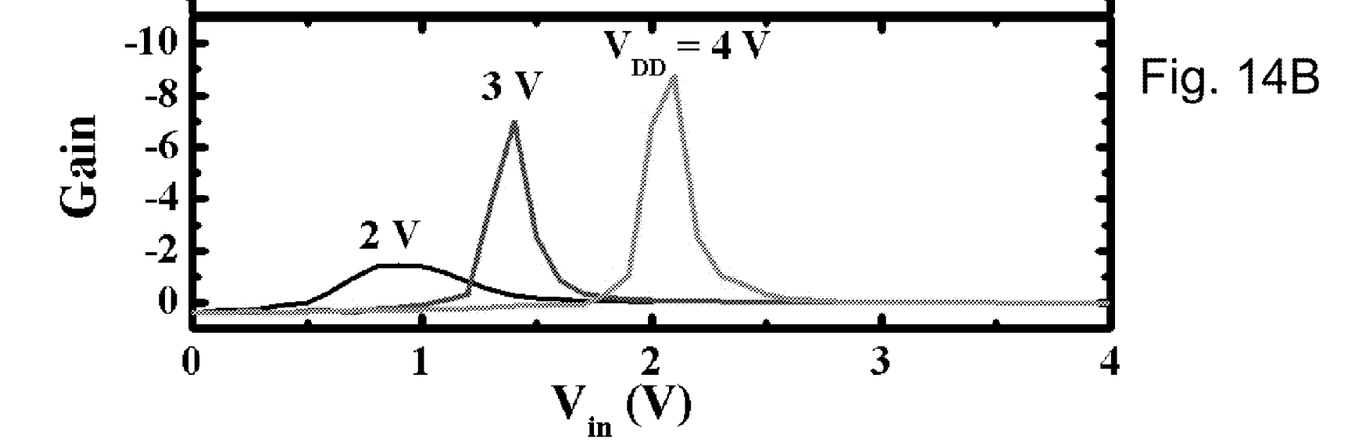

Referring to FIGS. 14A and 14B, the voltage transfer characteristics and the corresponding gain in complementary organic inverter 700 are shown as a function of input voltage for supply voltages $V_{DD}=2$ V, 3 V, and 4 V. When the input voltage $V_{IN}$ is low (e.g., −1 V), a high voltage is output; when the input voltage is high (e.g., −3 V), the output voltage becomes relatively low. The maximum gain of the inverter increases with increasing $V_{DD}$, reaching a peak value of −8.75 for $V_{DD}=4$ V. In comparison to the resistance-load inverter 500 whose behavior is shown in FIGS. 7A and 7B, the complementary organic inverter 700 exhibits enhanced gain at a lower driving voltage.

Figure 15:
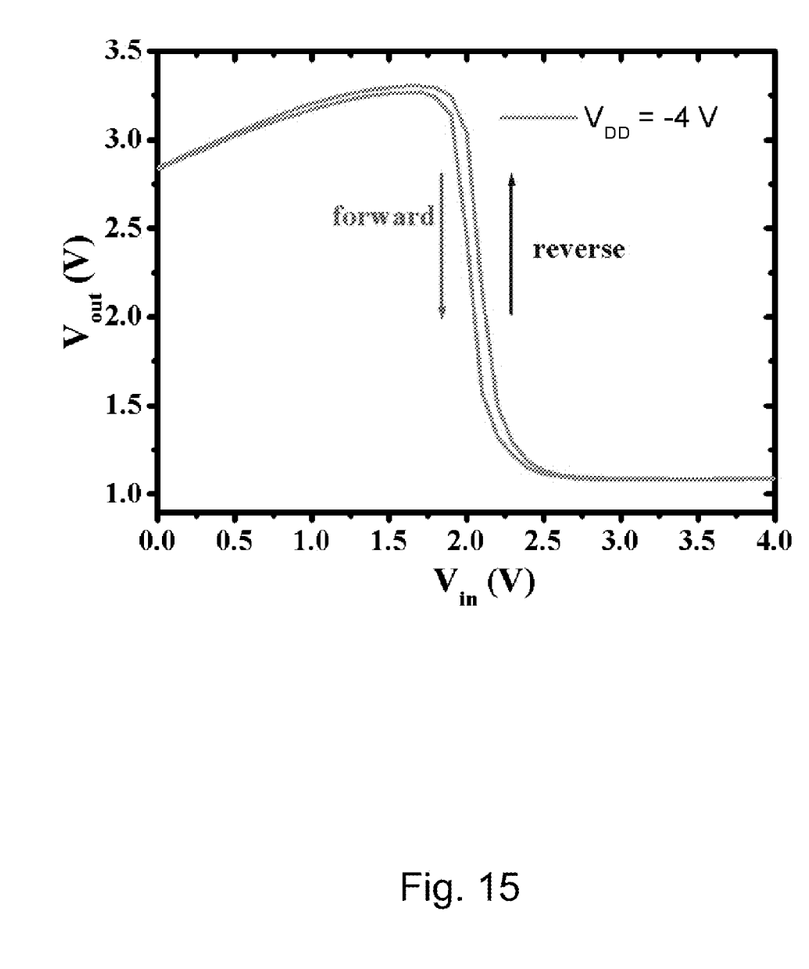
FIG. 15 is a graph showing the output voltage of the inverter of FIG. 12A as a function of input voltage in the forward and reverse directions.

Referring to FIG. 15, the voltage transfer characteristics for the complementary organic inverter 700 of FIG. 12A for $V_{DD}$=−4 V reveal a slight hysteresis. An ideal OBMT does not include the LiF insulator layer; a complementary organic inverter applying an ideal OBMT does not exhibit hysteresis. The minor hysteresis of inverter 700 can be attributed to carriers trapped by minor impurities in the active organic layers of OBMTs 710 and 720. In addition to hysteresis, the noise margin is an important performance parameter of an inverter. FIG. 15 shows a noise margin low ($NM_L$) value (i.e., a voltage range within which the inverter output is interpreted as a "0") of 0.97 V and a noise margin high ($NM_H$) value (i.e., a voltage range within which the inverter output is interpreted as a "1") of 0.82 V. These measured noise margin values are less than the theoretical values, predicted to be $NM_H$=$NM_L$=$V_{DD}$/2 (i.e., 2 V). This discrepancy is due to (1) the current mismatch between p-type OBMT 710 and n-type OBMT 720; (2) the non-zero OFF current in the OBMTs; and (3) the gradual shift in the turn-on voltage upon increasing the base voltage.

P-type OBMT 710 in inverter 700 is operated in a linear regime for low values of $V_{IN}$. A shift in the turn-on voltage of OBMT 710 would result in a change in the value of $V_{OUT}$ upon increasing $V_{IN}$ and a corresponding decrease in the values of $NM_H$ and $NM_L$. The electrical properties of complementary organic inverter 700 can be further improved by lowering the OFF currents and turn-on voltages of both p-type OBMT 710 and n-type OBMT 720.

3 Fabrication of OBMTs

The following section provides examples of fabricating OBMTs.

Referring again to FIG. 1B, substrate 108 (glass/plastic substrate) was first pre-cleaned by detergent, acetone, and isopropyl alcohol, and was then treated with an ultraviolet (UV) ozone cleaner for 15 min. Collector 105 is a 30 nm-thick Au layer deposited on substrate 108. Collector layer 130 includes a 40 nm-thick CuPc layer 134 (Luminescence Technology Corp.) thermally evaporated on collector 105 for smoothing surface morphology, and a 280 nm-thick pentacene layer 132 (Sigma-Aldrich, ~98% purity) thermally evaporated at a rate of 0.10-0.13 nm/sec from a crucible.

Base 103 is a 31 nm-thick Al layer thermally evaporated on pentacene layer 132. A 5 nm-thick Al layer is formed as base layer 120 over base 103. A 0.4 nm-thick LiF layer 116 was then thermally evaporated onto base layer 120 as a carrier injection enhancement layer. A 20 nm-thick NPB layer 114 was thermally evaporated onto LiF layer 116 to enhance carrier energy. Further, a 140 nm-thick pentacene layer 112 was thermally evaporated at a rate of 0.10-0.13 nm/sec onto NPB layer 114. Finally, a 30 nm-thick Au layer was thermally evaporated onto pentacene layer 112 to be emitter 101.

The above process was patterned by a metal mask. All organic and semiconductor materials and metal electrodes were deposited in a thermal evaporation chamber at a base pressure of $10^{-6}$ Torr. The active area of OBMT 100 is 4.2× $10^{-3}$ cm$^2$, which is defined by the intersectional area of emitter 101 and collector 105.

Referring again to FIG. 12, in another example, glass substrate 1200 was cleaned as described above. A 30 nm thick Au layer was deposited onto cleaned substrate 1200 and patterned to form collector electrode 1205. To form n-type OBMT 720, a layer of N,N'-dioctyl-3,4,9,10-perylenedicarboximide (PTCDI, Sigma-Aldrich, ~98% purity) was deposited above a portion of collector electrode 1205 to form collector layer 1250. A 30 nm thick Al strip was then formed on collector layer 1250 to serve as base electrode 1203 for both p-type OBMT 710 and n-type OBMT 720. A 15 nm thick Al layer was deposited over base electrode 1203, forming the base layer 1252 of n-type OBMT 720. To decrease the OFF current of inverter 700, the partially formed device was then annealed at 150° C. for 2 hours.

After the anneal, a 100 nm thick layer of $C_{60}$ was thermally evaporated onto base layer 1252 to function as the emitter layer 1254. The emitter electrode 1256 was formed by depositing and patterning a 30 nm thick silver (Ag) layer over emitter layer 1254 of n-type OBMT 720.

For p-type OBMT 710, a 50 nm thick layer 1234 of copper phthalocyanine (CuPc, Luminescence Technology Corp.) was thermally evaporated onto a portion of collector electrode 1205 to smooth the surface morphology, and a 270 nm thick layer 1232 of pentacene (Sigma Aldrich, ~98% purity) was thermally evaporated to form collector layer 1230. Base layer 1220 was formed by deposition of a 10 nm thick Al film. Thermal evaporation of a 0.4 nm thick LiF layer formed hole injection enhancement layer. A 20 nm thick layer 1214 of NPB was then thermally evaporated onto LiF layer 1216 as a carrier energy enhancement layer. To complete emitter layer 1210, a 100 nm thick layer 1212 of pentacene was thermally evaporated onto NPB layer 1214. Finally, a film containing a 10 nm layer of $WO_3$ and 30 nm of Al was deposited onto emitter layer 1210 of p-type OBMT 710 to form the emitter electrode 1201.

All organic materials were used as received and thermally evaporated in a thermal evaporation chamber at a base pressure of $10^{-6}$ Ton. Patterning was performed using a metal mask; the active area of each OBMT 710, 720 was 0.04 cm$^2$.

4 Other Experimental Conditions

The pentacene-based planar-type OTFT listed in Table 1 was fabricated on heavily doped p-type silicon wafer with a 300 nm-thick layer of thermally oxidized silicon dioxide ($SiO_2$). A 50 nm pentacene film was then deposited onto $SiO_2$ through a thermal evaporation process. The width (W) and length (L) of the planar-type OTFT is 2000 μm and 100 μm, respectively. The field-effect mobility of the planar-type OTFT in saturation region is estimated by using the following equation:

$$I = \frac{1}{2}\frac{W}{L}C_i\mu(V_{GS} - V_T)^2 \quad (3)$$

where $C_i$ is the capacitance per unit area of $SiO_2$, $V_T$ is the threshold voltage, $V_{GS}$ is the gate-source voltage, and μ is the field-effect mobility.

The on- and off-currents of the conventional OTFT are defined as the source-drain current ($I_{DS}$) at gate voltage ($V_G$) of −40 and 0 V, respectively, when a source-drain voltage ($V_{DS}$) of −40 V is applied. The current-voltage (I-V) characteristics of the planar-type OTFT were measured by a HP 4145B semiconductor parameter analyzer or a Keithley 4200-SCS semiconductor parameter analyzer. The capacitance-voltage (C-V) measurements were performed with a HP 4980A Precision LCR meter.

The operating frequencies of OBMT 100 and the conventional OTFT were measured using test circuit 400 shown in FIG. 1A. As described earlier, test circuit 400 includes function generator 402 (e.g., Tektronix AFG 3022), oscilloscope 404 (e.g., Instek GDS-8065), and resistor 403 of 300 kΩ. All the electrical properties of the OBMT and OTFT were measured in dark under ambient environment or under a nitrogen ($N_2$) atmosphere.

5 Other Embodiments

All of the features disclosed in this specification may be combined in any combination. Each feature disclosed in this specification may be replaced by an alternative feature serving the same, equivalent, or similar purpose. Thus, unless expressly stated otherwise, each feature disclosed is only an example of a generic series of equivalent or similar features.

From the above description, one skilled in the art can easily ascertain the essential characteristics of the present invention, and without departing from the spirit and scope thereof, can make various changes and modifications of the invention to adapt it to various usages and conditions. Thus, other embodiments are also within the claims.

What is claimed is:

1. An inverter comprising:
   a transistor for receiving an input signal and for generating an output signal, the transistor including:
      a first semiconductor layer associated with a first electrode, the first semiconductor layer having an RMS roughness of at least about 10 nm;
      a second semiconductor layer associated with a second electrode; and
      a discontinuous layer between the first and second semiconductor layers; and
   a resistor coupled in series with the transistor,
   wherein the output signal satisfies a predetermined criterion in relation to the input signal.

2. The inverter of claim 1, wherein the input signal includes an input voltage signal, and the out signal includes an output voltage signal.

3. The inverter of claim 2, wherein the predetermine criterion includes, when a magnitude of the input voltage signal is within a predetermined range, the output voltage signal is in reverse polarity with the input voltage signal.

4. The inverter of claim 1, wherein the discontinuous layer is associated with a third electrode.

5. The inverter of claim 4, wherein the input signal is received at the third electrode and the output signal is generated at the second electrode.

6. The inverter of claim 1, wherein the inverter is configured to be able to operate at a frequency of at least 2000 Hz.

7. The inverter of claim 1, wherein the first semiconductor layer includes a pentacene layer.

8. The inverter of claim 1, wherein the second semiconductor layer includes a pentacene layer.

9. The inverter of claim 1, wherein the discontinuous layer includes a plurality of openings formed on a non-uniform organic surface.

10. The inverter of claim 1, wherein the discontinuous layer includes Al.

11. An inverter comprising:
    a first transistor having a first base electrode for receiving an input signal and a first collector electrode for providing an output signal that satisfies a predetermined criterion in relation to the input signal; and
    a second transistor having a second base electrode and emitter electrode each connected to the first collector electrode of the first transistor;
    wherein at least one of the first and second transistors has a first and a second semiconductor layer and a discontinuous layer between the first and second semiconductor layers, and
    wherein the first semiconductor layer has an RMS roughness of at least about 10 nm.

12. The inverter of claim 11, wherein each of the first and second transistors is a p-type transistor.

13. The inverter of claim 11, wherein each of the first and second transistors is an n-type transistor.

14. An inverter comprising:
    a first transistor having a first base electrode for receiving an input signal and a first collector electrode for providing an output signal that satisfies a predetermined criterion in relation to the input signal; and
    a second transistor having a second base electrode connected to the first base electrode and a second collector electrode connected to the first collector electrode;
    wherein at least one of the first and second transistors has a first and a second semiconductor layer and a discontinuous layer between the first and second semiconductor layers, and
    wherein the first semiconductor layer has an RMS roughness of at least about 10 nm.

15. The inverter of claim 14, wherein the first transistor is a p-type transistor, and the second transistor is an n-type transistor.

16. The inverter of claim 14, wherein the first transistor is an n-type transistor, and the second transistor is a p-type transistor.

17. The inverter of claim 14, wherein each of the first and second transistors is an ambipolar transistor.

* * * * *